(12) United States Patent
Chen et al.

(10) Patent No.: US 8,654,532 B2
(45) Date of Patent: Feb. 18, 2014

(54) SERVER CABINET COOLANT DISTRIBUTION SYSTEM

(75) Inventors: Chien-An Chen, Taipei (TW); Wei-Ta Shih, Taipei (TW)

(73) Assignee: Inventec Corporation, Taipei (TW)

( * ) Notice: Subject to any disclaimer, the term of this patent is extended or adjusted under 35 U.S.C. 154(b) by 218 days.

(21) Appl. No.: 13/297,446

(22) Filed: Nov. 16, 2011

(65) Prior Publication Data

US 2013/0043775 A1  Feb. 21, 2013

(30) Foreign Application Priority Data

Aug. 19, 2011  (TW) .............................. 100129843 A

(51) Int. Cl.
*H05K 7/20*  (2006.01)
(52) U.S. Cl.
USPC .................. 361/701; 361/679.47; 361/679.53; 361/689; 361/698; 361/699; 165/80.2; 165/80.5; 165/104.19; 165/104.22; 165/104.33; 137/247; 137/315.01; 137/595; 137/614.03; 62/259.2
(58) Field of Classification Search
USPC ............... 361/679.46–679.55, 690–702, 688, 361/689, 704–712, 715–727; 165/80.2–80.5, 104.14, 104.19, 165/104.22, 104.33, 185; 137/247, 315.01, 137/595, 614.03; 62/259.2
See application file for complete search history.

(56) References Cited

U.S. PATENT DOCUMENTS

| | | | | |
|---|---|---|---|---|
| 6,714,412 | B1 * | 3/2004 | Chu et al. ....................... | 361/699 |
| 6,807,056 | B2 * | 10/2004 | Kondo et al. .................. | 361/689 |
| 7,057,893 | B2 * | 6/2006 | Nicolai et al. ................. | 361/699 |
| 7,187,549 | B2 * | 3/2007 | Teneketges et al. .......... | 361/699 |
| 7,318,322 | B2 * | 1/2008 | Ota et al. ....................... | 62/259.2 |
| 7,408,775 | B2 * | 8/2008 | Walz et al. ..................... | 361/699 |
| 7,446,549 | B2 * | 11/2008 | Tomita et al. .............. | 324/750.3 |
| 7,450,385 | B1 * | 11/2008 | Campbell et al. ............. | 361/699 |
| 7,635,020 | B2 * | 12/2009 | Hartel et al. ................... | 165/157 |
| 7,799,474 | B2 * | 9/2010 | Lyon et al. ..................... | 429/428 |
| 8,035,972 | B2 * | 10/2011 | Ostwald et al. ............... | 361/699 |
| 2006/0256526 | A1 * | 11/2006 | Hamman ....................... | 361/699 |
| 2011/0112694 | A1 * | 5/2011 | Bash et al. .................... | 700/277 |
| 2011/0240281 | A1 * | 10/2011 | Avery ............................ | 165/287 |
| 2011/0313576 | A1 * | 12/2011 | Nicewonger .................. | 700/282 |

FOREIGN PATENT DOCUMENTS

| | | |
|---|---|---|
| TW | I237174 | 8/2005 |
| TW | I311903 | 7/2009 |

* cited by examiner

*Primary Examiner* — Michail V Datskovskiy
(74) *Attorney, Agent, or Firm* — Huffman Law Group, P.C.

(57) ABSTRACT

A cooling coolant pipe of a server cabinet includes multiple tube bodies interconnected in series and at least one adjustable valve. In each of the tube bodies a first chamber and a second chamber that are adjacent to and separated from each other, the second chambers of the two adjacent tube bodies are in communication with each other, and a wall surface of each of the tube bodies has at least one connection port in communication with the first chamber. The adjustable valve is disposed in one of the tube bodies. The first chamber in each of the tube bodies is in communication with the second chamber in the tube body through the adjustable valve. In this way, the adjustable valve adjusts the flow rate of a cooling fluid flowing from the second chamber to the first chamber.

14 Claims, 5 Drawing Sheets

SERVER CABINET COOLANT DISTRIBUTION SYSTEM

CROSS-REFERENCE TO RELATED APPLICATIONS

This non-provisional application claims priority under 35 U.S.C. §119(a) on Patent Application No(s). 100129843 filed in Taiwan, R.O.C. on Aug. 19, 2011, the entire contents of which are hereby incorporated by reference.

BACKGROUND

1. Technical Field

The disclosure relates to a cabinet and a coolant distribution system thereof, and more particularly to a server cabinet and a coolant distribution system thereof.

2. Related Art

Currently heat dissipation modules of cabinet servers mostly adopt an air-cooled heat dissipation mode. The principles are as follows: a heat dissipation fin is disposed at a heat source at a tray in a cabinet, and a heat dissipation fan module is disposed at the cabinet, so that forced thermal convection caused by the fan module facilitates heat dissipation of the heat source. However, when the heat dissipation fin dissipates heat from the heat source, a problem of heat dissipation of other heat sources is caused. For example, when an air flow flows through an upstream heat source to remove heat energy generated by the upstream heat source, the temperature of the air flow is increased. When the temperature of the air flow is increased, the temperature difference between the air flow and a downstream heat source is smaller, thereby decreasing the efficiency of the heat dissipation of the downstream heat source.

In contrast, a liquid-cooled heat dissipation module provides another heat dissipation mode. The heat dissipation module based on liquid cooling does not perform cooling through air, so that air channel required by flowing of an air flow is not required to be taken into account. The heat dissipation module based on liquid cooling includes a cooling device and a cooling pipeline connected to the cooling device. The cooling device and the cooling pipeline are disposed at a cabinet, and the cooling pipeline is connected to a heat exchanger disposed on a heat source. The cooling device provides a cooling fluid, the cooling fluid flows to the heat exchanger through the cooling pipeline, and the cooling fluid performs heat exchange in the heat exchanger to remove heat energy generated by the heat source.

Moreover, the trays loading with heat sources are disposed in a stack, so that each of the heat exchangers has different relative height. The cooling pipeline is generally disposed at the cabinet in a vertical manner to be correspondingly connected to all of the heat exchangers arranged in a stack in a vertical direction. However, when the cooling fluid flows in the cooling pipeline, the cooling fluid flows horizontally to generate a pressure difference between the cooling fluids at different heights in the cooling pipeline. Therefore, due to the fluid pressure differences, each of the flow rates of the cooling fluid acquired by the heat exchangers is different, resulting in different heat dissipation efficiencies of the heat exchangers.

SUMMARY

The disclosure is a coolant distribution and circulation system of a server cabinet, to solve a problem that due to fluid pressure differences, the flow rate of a cooling fluid acquired by heat exchangers is different, resulting in different heat dissipation efficiencies of the heat exchangers.

A server cabinet of the disclosure is applicable to accommodating at least one tray. The tray bears at least one heat source and a heat exchanger disposed on the heat source. The coolant distribution system of the server cabinet comprises a first coolant pipe or primary supply flow duct, a second coolant pipe or primary return flow duct, and a cooling circulation power device. The first coolant pipe comprises multiple modular tube or source flow bodies interconnected in series and at least one adjustable valve. In each of the tube bodies, a first (auxiliary) chamber and a second (arterial) chamber are adjacent to and separated from each other, the second chambers of two adjacent tube bodies are in communication with each other, each of the tube bodies has at least one connection port (optionally in the form of a tube fitting) in communication with the first (auxiliary) chamber, and the connection port is suitable for being connected to the heat exchanger. The adjustable valve is disposed in one of the tube bodies. The first chamber in each of the tube bodies is in communication with the second chamber in the tube body through the adjustable valve. The second coolant pipe is suitable for being connected to the heat exchanger. The cooling circulation power device is connected to the first coolant pipe and the second coolant pipe. The cooling circulation power device is used to drive a cooling fluid to flow to the second chambers of the tube bodies of the first coolant pipe. The adjustable valve is used to adjust the flow rate of the cooling fluid in the corresponding tube body flowing from the second chamber to the first chamber. The cooling fluid flows from the first chamber to the heat exchanger to perform heat exchange on the heat source and flows back to the cooling circulation power device through the second coolant pipe.

A first coolant pipe or primary supply flow duct of the disclosure comprises multiple tube bodies interconnected in series and at least one adjustable valve. In each of the tube bodies, a first chamber and a second chamber are adjacent to and separated from each other. The second chambers of the two adjacent tube bodies are in direct series communication with each other, but the first chambers of each of any tube adjacent tube bodies are isolated from each other, except through the connection ports through which the first chambers communicate with their corresponding second chambers. A wall surface of each of the tube bodies has at least one connection port in communication with the first chamber. The adjustable valve is disposed in at least one of, and preferably in each one of, the tube bodies. The first chamber in each of the tube bodies is in communication with the second chamber in the tube body through the adjustable valve.

According to the server cabinet coolant distribution system of the disclosure, the first coolant pipe comprises the multiple tube bodies connected in series. An adjustable valve for adjusting the flow rate of a cooling fluid may be disposed in at least one of, and preferably in each one of, the tube bodies, and each adjustable valve controls a rate of flow of the cooling fluid from the second chamber into the corresponding first chamber. Moreover, each of the adjustable valves is operable to be adjusted (e.g., manually, electronically, automatically, and/or feedback-controlled), relative to the adjustment of each of the other adjustable valves, so that an appropriate flow of coolant (e.g., an approximately equal amount of coolant, or a temperature-feedback controlled amount of coolant) is circulated into each of the multiple tube bodies. In this way, the output flow rates, in mass or volume of fluid per unit time, of the cooling fluid of the tube bodies at different heights can be close to each other, so that the heat exchangers on the trays acquire almost the same flow rate of the cooling fluid, thereby enabling the heat exchangers to achieve almost the same heat dissipation efficiency.

BRIEF DESCRIPTION OF THE DRAWINGS

The disclosure will become more fully understood from the detailed description given herein below for illustration only, and thus are not limitative of the present disclosure, and wherein.

DETAILED DESCRIPTION

Figure 1:
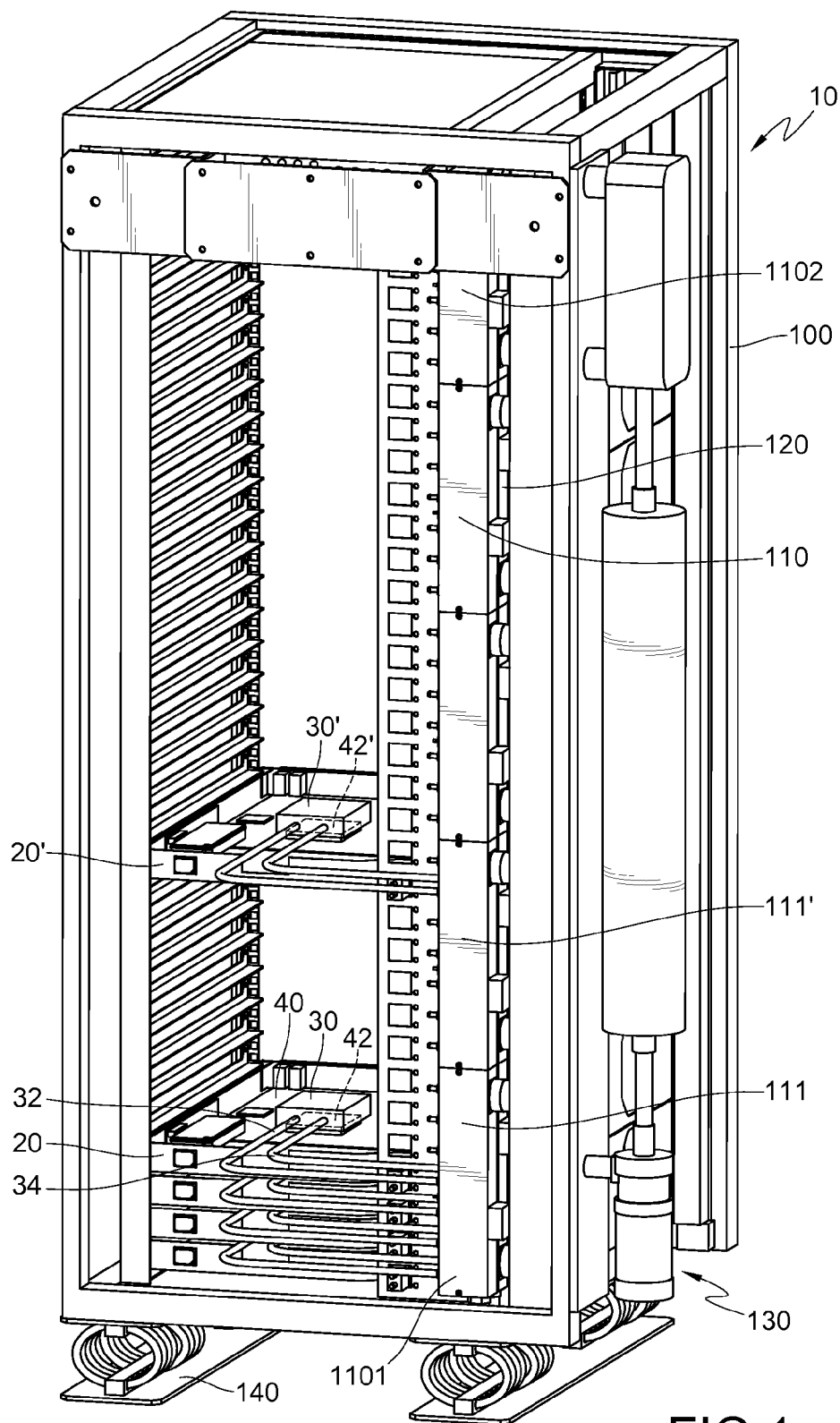
FIG. 1 is a schematic structural view of a server cabinet according to an embodiment.

FIG. 1 is a schematic structural view of a server cabinet according to an embodiment. Referring to FIG. 1, a server cabinet 10 according to this embodiment is suitable for accommodating multiple trays 20 and 20'. The trays 20 and 20' bear two heat sources 42 and 42', and two heat exchangers 30 and 30' disposed on the heat sources 42 and 42' respectively. Taking the tray 20 for example, the tray 20 is used for bearing a motherboard 40 of a server, and the heat source 42 is a computing chip or other electronic elements capable of generating heat energy and located on the motherboard 40. The heat exchanger 30 is disposed on the heat source 42 in a thermal contact manner. The heat exchanger 30 is used for removing the heat energy generated by the heat source 42 to avoid the high temperature in the server cabinet 10.

The server cabinet 10 comprises a cabinet body 100, a first coolant pipe or primary supply flow duct 110, a second coolant pipe or primary return flow duct 120, and a cooling circulation power device 130. Taking the tray 20 for example, when the tray 20 is accommodated in the cabinet body 100, the heat exchanger 30 on the heat source 42 may be connected to the first coolant pipe 110 and the second coolant pipe 120 respectively. Specifically, the heat exchanger 30 has two tributary ducts 32 and 34. The tributary duct 32 is connected to the first coolant pipe 110, and the tributary duct 34 is connected to the second coolant pipe 120, so that the heat exchanger 30 is connected to the first cooling coolant pipe 110 and the second coolant pipe 120 respectively.

Furthermore, the cooling circulation power device 130 may comprise a cooler and a pump. The cooling circulation power device 130 is connected to the first coolant pipe 110 and the second coolant pipe 120. The cooling circulation power device 130 is used for driving a cooling fluid to flow to the heat exchanger 30 through the first coolant pipe 110, so that the cooling fluid performs heat exchange with the heat exchanger 30, thereby removing the heat energy absorbed by the heat exchanger 30. After the heat exchange, the cooling fluid flows from the heat exchanger 30 to the second coolant pipe 120, and then flows to the cooling circulation power device 130 for cooling and removing the heat energy. In this way, a cycle of the cooling fluid operation is completed.

Figure 2:
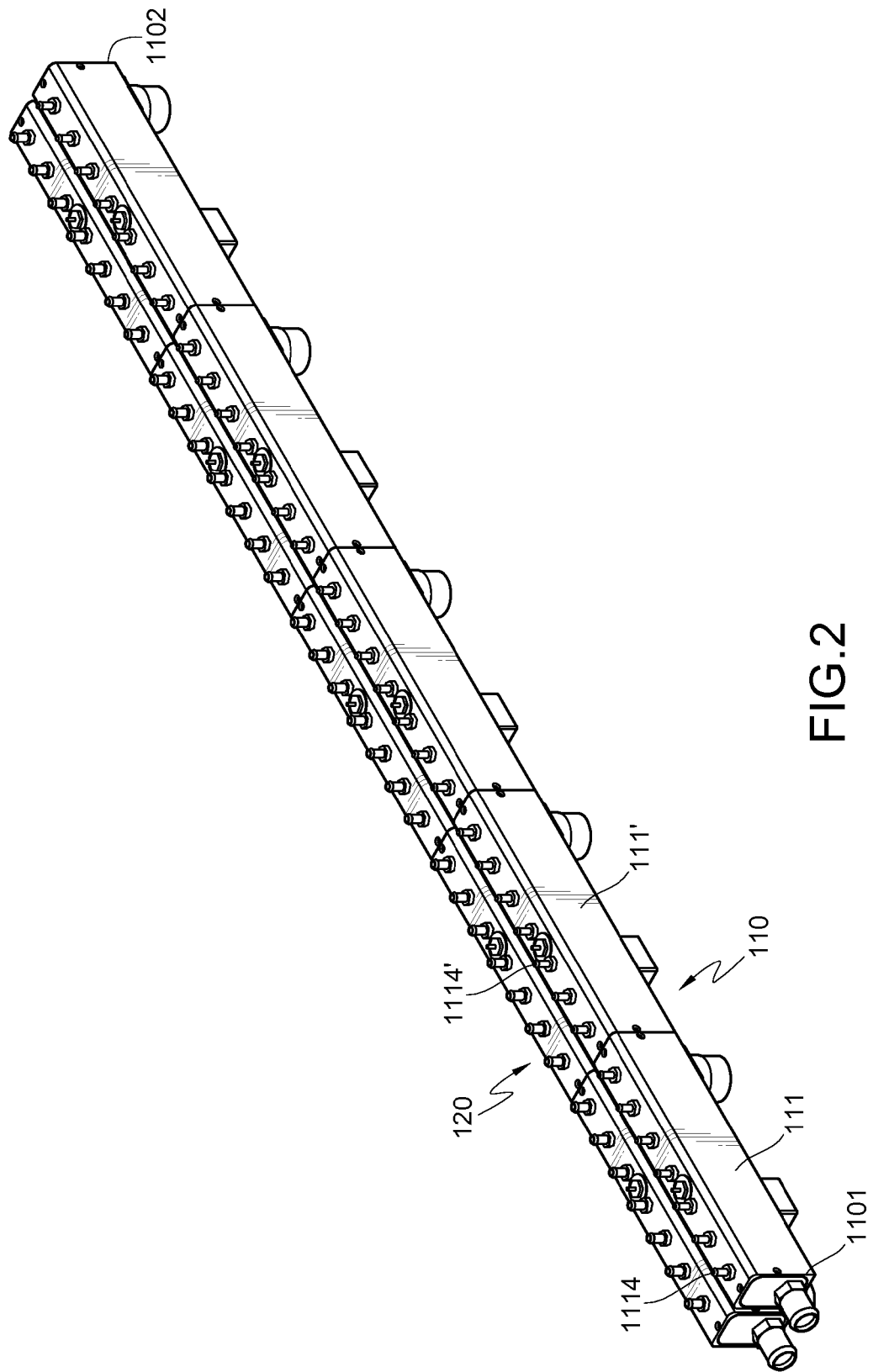
FIG. 2 is a schematic structural view of a coolant distribution system according to an embodiment.
Figure 3:
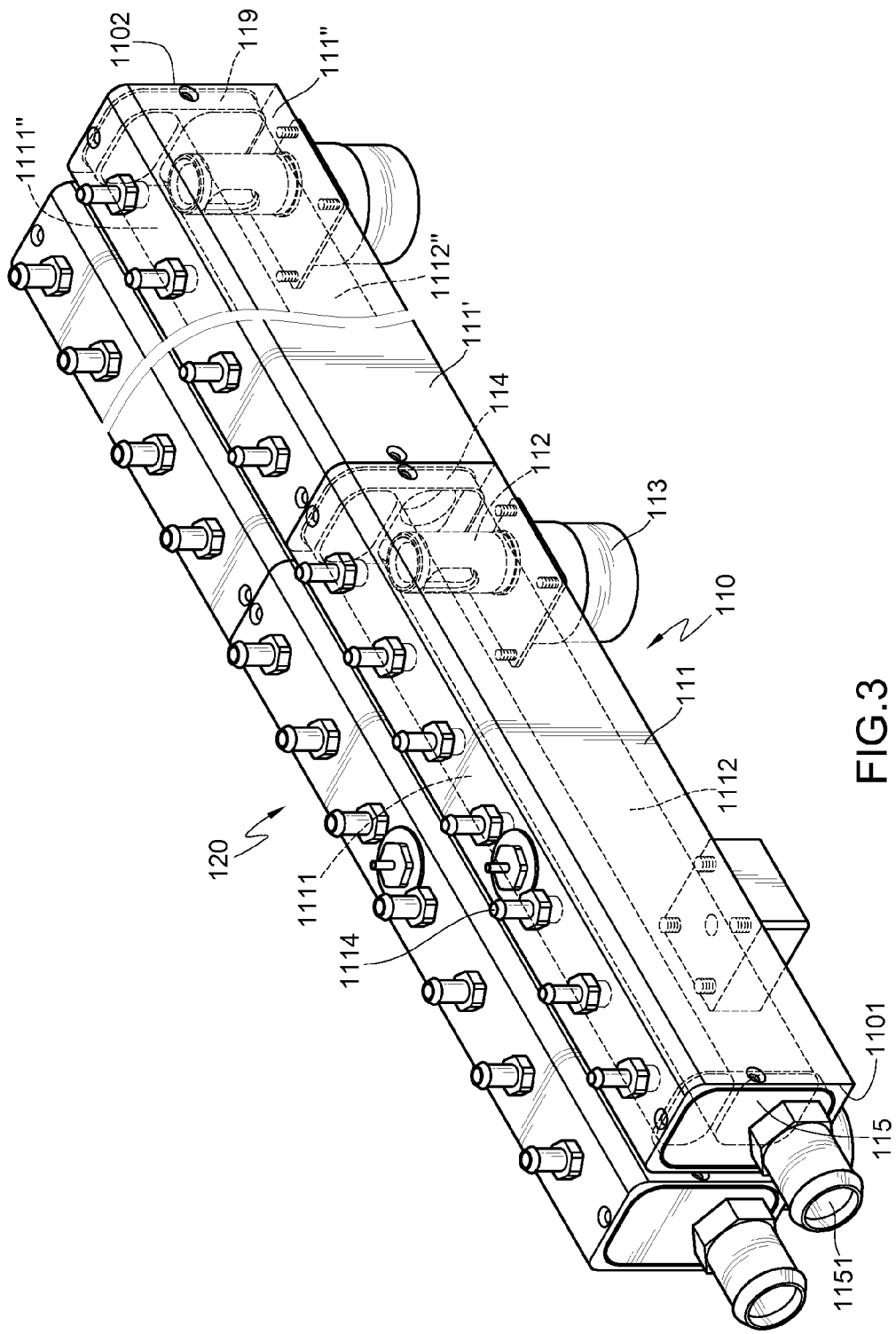
FIG. 3 is a partially enlarged structural view of a coolant distribution system according to an embodiment.
Figure 4:
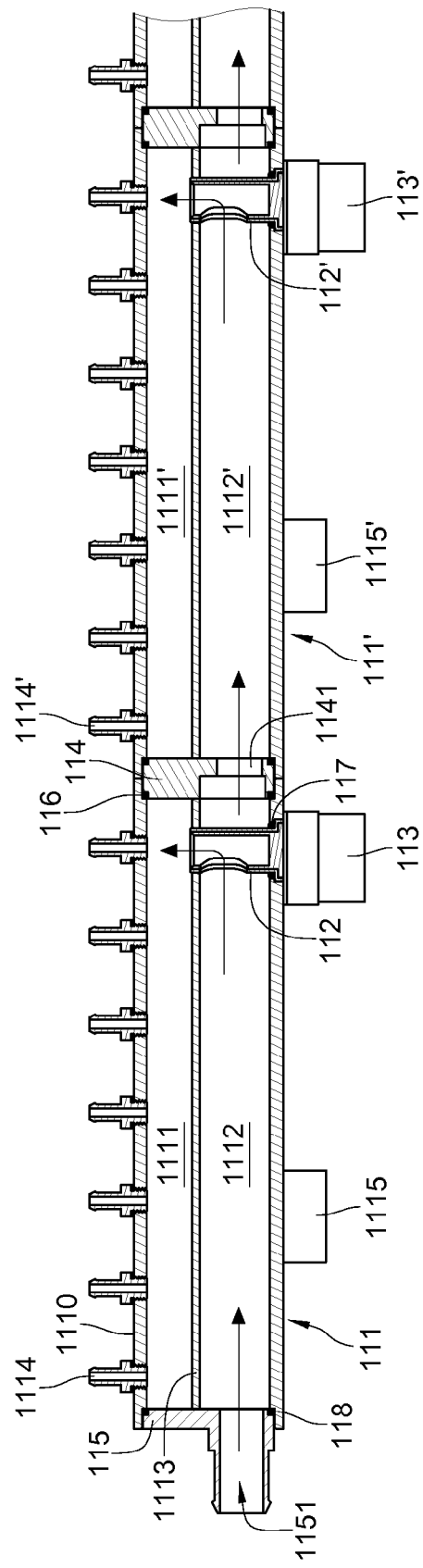
FIG. 4 is a partial structural cross-sectional view of a coolant distribution system according to an embodiment.

FIG. 2 is a schematic structural view of the primary supply flow and primary return flow ducts of a coolant distribution system according to an embodiment, FIG. 3 is a partially enlarged structural view of a coolant distribution system according to an embodiment, and FIG. 4 is a partial structural cross-sectional view of a coolant pipe or primary supply flow duct according to an embodiment. Referring to FIG. 2 to FIG. 4 as well as FIG. 1, the first coolant pipe 110 according to this embodiment comprises multiple tube or modular source flow bodies 111 interconnected in series and at least one adjustable valve 112. Otherwise, the first coolant pipe 110 illustrated in this embodiment is formed by five tube bodies 111 interconnected in series, but the number of the tube bodies 111 is not intended to limited the disclosure. Persons skilled in the art may adjust the number of the tube bodies 111 according to the actual size of the cabinet body 100. In addition, the number of the adjustable valves 112 according to one embodiment preferably matches the number of the tube bodies 111.

Internal structures of the tube bodies 111 are similar, so that a specific structure of the first coolant pipe 110 is described in the following according to the two adjacent tube bodies 111 and 111' at a first end 1101 of the first coolant pipe 110.

In this embodiment, in the tube body 111, a first (or auxiliary) chamber 1111 and a second (or arterial) chamber 1112 are adjacent to and separated from each other. In the tube body 111', a first chamber 1111' and a second chamber 1112' are adjacent to and separated from each other. Description is further provided by taking the tube body 111 as an example, a wall body 1113 exists in the tube body 111, and the wall body 1113 extends along a longitudinal direction of the tube body 111, to separate the internal space of the tube body 111 into the first chamber 1111 and the second chamber 1112 extending longitudinally. Furthermore, the adjustable valve 112 according to this embodiment is disposed in the second chamber 1112, and the first chamber 1111 is in communication with the second chamber 1112 through a port controlled by the adjustable valve 112. Furthermore, the adjustable valve 112 is used for controlling the flow rate of the cooling fluid flowing from the second chamber 1112, through the valve-controlled port, to the first chamber 1111. In addition, the second chamber 1112 and the second chamber 1112' of the two adjacent tube bodies 111 and 111' are in direct series communication with each other, so that the cooling fluid flowing into the second chamber 1112 may continuously flow to the second chamber 1112'. It should be noted that, in this embodiment, the adjustable valve 112 is disposed in the second chamber 1112, but the disclosure is not limited thereto. For example, the adjustable valve 112 may also be disposed in the first chamber 1111.

In addition, a wall surface 1110 of the tube body 111 has at least one connection port 1114 in communication with the first chamber 1111. The connection port 1114, which may be in the form of a tube fitting, is used for providing a leak-proof connection to the tributary duct 32 of the heat exchanger 30. The cooling fluid in the first chamber 1111 flows to the heat exchanger 30 through the connection port 1114. Furthermore, the first chamber 1111 and the first chamber 1111' of the adjacent two tube bodies 111 and 111' are separated and isolated from one another by one or more wall bodies, so that the cooling fluid flowing from the second chamber 1112 to the first chamber 1111 cannot flow to the first chamber 1111' continuously. The wall body for separating the first chamber 1111 and the first chamber 1111' may be disposed between the tube body 111 and the tube body 111', or adjacent wall bodies may be disposed in each of the tube body 111 and the tube body 111'. In one embodiment, the first coolant pipe 110 has a first joint member 114. The first chamber 1111 and the first chamber 1111' are separated by a wall body of the first joint member 114. More specifically, the first joint member 114 is disposed between the adjacent tube body 111 and tube body 111'. The first joint member 114 separates the adjacent first chamber 1111 and first chamber 1111'. In addition, the first joint member 114 has a through hole 1141, and the adjacent second chamber 1112 and second chamber 1112' are in direct series communication with each other through the through hole 1141.

Furthermore, the first coolant pipe 110 according to this embodiment further has a second joint member 115, and the second joint member 115 has a fluid port 1151. The second joint member 115 is disposed at one end of the tube body 111 to which the cooling circulation power device 130 is connected. The second joint member 115 closes the first chamber 1111 of the tube body 111. The second chamber 1112 of the tube body 111 is connected to the cooling circulation power device 130 through the fluid port 1151. More specifically, the cooling circulation power device 130 drives the cooling fluid to enter the second chamber 1112 through the fluid port 1151 of the tube body 111, one part of the cooling fluid in the second chamber 1112 flows to the first chamber 1111 through the adjustable valve 112, and another part of the cooling fluid in the second chamber 1112 flows to the second chamber 1112' of the adjacent tube body 111' through the through hole 1141. The cooling fluid flowing from the second chamber 1112 to the second chamber 1112' may further flow to the first chamber 1111' of the same tube body 111' through an adjustable valve 112', or continue to flow to the second chamber of a next adjacent tube body.

In addition, the first coolant pipe 110 according to this embodiment further has a closing member 119, and the closing member 119 is disposed on a terminal end of a tube body 111" at a second end 1102 of the first coolant pipe 110. The closing member 119 closes a first chamber 1111" and a second chamber 1112" of the tube body 111" at the second end 1102 at the same time, to prevent the cooling fluid in the tube body 111" from leaking out.

Referring to FIG. 1 in combination with FIG. 4, a bottom of the cabinet body 100 according to this embodiment may further have a support stand 140, and the cabinet body 100 is disposed on a plane by the support stand 140. Furthermore, the trays 20 and 20' are disposed in the cabinet body 100 of the server cabinet 10 according to this embodiment in a stack in the vertical direction, and the first coolant pipe 110 and the second coolant pipe 120 are disposed upright at the cabinet body 100, so the first coolant pipe 110 and the second coolant pipe 120 match the positions at which the trays 20 and 20' are disposed at the same time. Description is further provided by taking the first coolant pipe 110 as an example. The first coolant pipe 110 has the first end 1101 and the second end 1102 opposite to each other. The distance from the first end 1101 to the support stand 140 is smaller than that from the second end 1102 to the support stand 140. That is to say, a relative height of the first end 1101 is smaller than that of the second end 1102. It should be noted that, the manner in which the first coolant pipe 110 and the second coolant pipe 120 are disposed is not intended to limit the disclosure, provided that the relative height of the second end 1102 of the first coolant pipe 110 is greater than that of the first end 1101 of the first coolant pipe 110.

Furthermore, the first coolant pipe 110 is connected to the cooling circulation power device 130 through the first end 1101, so that the cooling fluid in the first coolant pipe 110 flows from the first end 1101 to the second end 1102, that is, the cooling fluid in the first coolant pipe 110 flows upwards. Moreover, the flow direction of the cooling fluid from the heat exchanger 30 to the second coolant pipe 120 is opposite to that of the cooling fluid to the first coolant pipe 110. That is to say, the cooling fluid in the second coolant pipe 120 flows downwards.

Based on the above description, the first coolant pipe 110 according to this embodiment controls the flow rate of the cooling fluid flowing from the tube body 111 to the heat exchanger 30 through the adjustable valve 112 in the tube body 111, so that the output volumes of the cooling fluid of the tube bodies 111 at different heights may be close to each other.

For example, the tray 20 and the tray 20' shown in FIG. 1 are at different heights, and a distance from the tray 20 to the support stand 140 is smaller than that from the tray 20' to the support stand 140. That is to say, the tray 20' is located above the tray 20. The heat exchanger 30' on the tray 20' is connected to the tube body 111' of the first coolant pipe 110, and the heat exchanger 30 on the tray 20 is connected to the tube body 111 of the first coolant pipe 110. The tube body 111 is located below the tube body 111', so that a pressure of the cooling fluid in the tube body 111 is greater than that of the cooling fluid in the tube body 111'. According to the disclosure, the adjustable valve 112 in the tube body 111 and the adjustable valve 112' in the tube body 111' may be adjusted, so as to make a valve port of the adjustable valve 112 be slightly smaller than that of the adjustable valve 112', thereby equalizing the output flow volume of the tube body 111 and that of the tube body 111', and reducing a difference between the flow rate of the cooling fluid in the heat exchanger 30 on the tray 20 and that of the cooling fluid in the heat exchanger 30' on the tray 20'.

In this way, even if the cabinet body 100 accommodates multiple trays 20 located at different relative heights, the differences between the flow rates of the cooling fluid acquired by the heat exchangers 30 on the trays 20 can be reduced by adjusting the adjustable valves 112 in the tube bodies 111, to make the heat dissipation efficiencies of the heat exchangers 30 close to each other.

In addition, the first coolant pipe 110 according to this embodiment further has drivers 113 and the number of drivers 113 matches that of the adjustable valves 112. The driver 113 and the connection port 1114 are located on two opposite sides of the first coolant pipe 110. The driver 113 may be a motor. The driver 113 is connected to the adjustable valve 112, and serves as a power source of the adjustable valve 112. The driver 113 is used for driving the adjustable valve 112, to enable the adjustable valve 112 to control the output flow volume of the cooling fluid. Each of the drivers 113 is controlled by a signal respectively, to adjust the flow rate of the tube body 111 or the tube body 111' automatically and immediately. More particularly, each of the drivers, in conjunction with associated control and feedback sensory equipment (not shown), is operable to adjust each of the adjustable valves, relative to the adjustment of each of the other adjustable valves, so that an appropriate flow of coolant (e.g., an approximately equal amount of coolant, or a temperature-feedback controlled amount of coolant) is circulated into each of the multiple tube bodies. In addition, the first coolant pipe 110 further has racks 1115 and the number of racks 1115 matches that of the tube bodies 111. The rack 1115 and the driver 113 are located on the same side of the tube body 111. The rack 1115 may be used for fixing the first coolant pipe 110 to the cabinet body 100.

Furthermore, the tube body 111 according to this embodiment is a modular design, that is, the tube bodies 111, 111', and 111" may have the same shape. An assembler may adjust the number of the tube bodies 111, 111', and 111" according to actual needs, and connect the multiple tube bodies 111 in series by using an appropriate number of the first joint members 114, the second joint member 115 and the closing member 119 to form the first coolant pipe 110 of an expected length. To meet the demands of modularization, the structure of the second coolant pipe 120 according to this embodiment may adopt the same mode as that of the first coolant pipe 110. Besides, the structure of the second coolant pipe 120 is not necessarily the same as that of the first coolant pipe 110. In another embodiment, the second coolant pipe 120 may also be a common coolant pipe, and only the first coolant pipe 110 has the effect of adjusting the flow rate of the cooling fluid segment by segment, which may also achieve the effect of this embodiment.

In addition, the adjustable valve 112 according to this embodiment is disposed in the second chamber 1112 of each of the tube bodies 111, and is located at a relatively high point of the tube body 111. The relatively high point of each of the tube bodies 111 refers to the end of each of the tube bodies 111 farther away from the support stand 140. Such a structural design can reduce the influence of the fluid pressure on the adjustable valve 112.

In addition, the first coolant pipe 110 may further have three sealing rings 116, 117, and 118. The sealing ring 116 is annularly disposed between the tube body 111 and the first joint member 114, and is used for sealing an assembly clearance between the first joint member 114 and the tube body 111. The sealing ring 117 is annularly disposed between the tube body 111 and the adjustable valve 112, and is used for sealing an assembly clearance between the adjustable valve 112 and the tube body 111. The sealing ring 118 is annularly disposed between the tube body 111 and the second joint member 115, and is used for sealing an assembly clearance between the second joint member 115 and the tube body 111. By disposing the sealing rings 116, 117, and 118, the cooling fluid in the first coolant pipe 110 can be prevented from leaking out.

Figure 7:
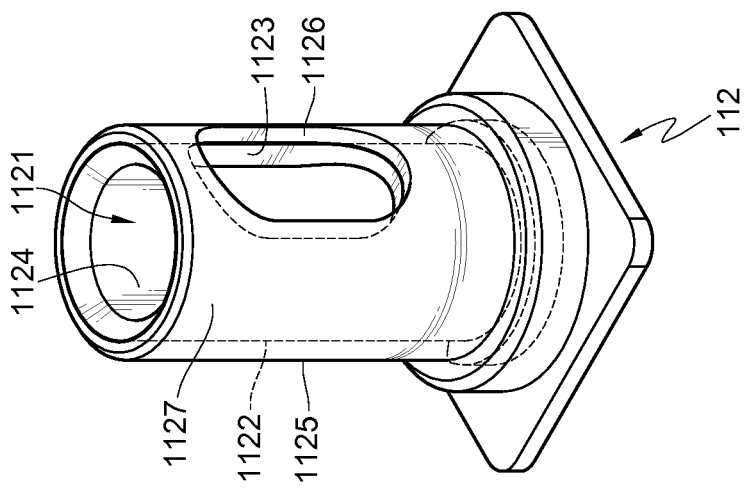
FIG. 5 to FIG. 7 are schematic views of operation of an adjustable valve according to an embodiment.
Figure 6:
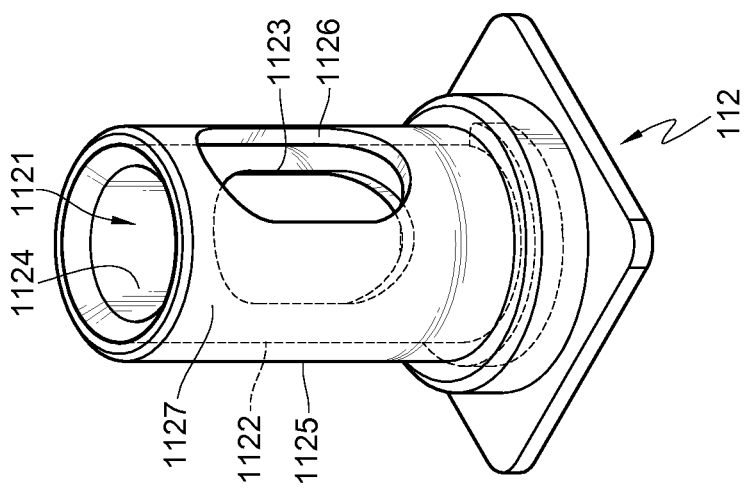
Figure 5:
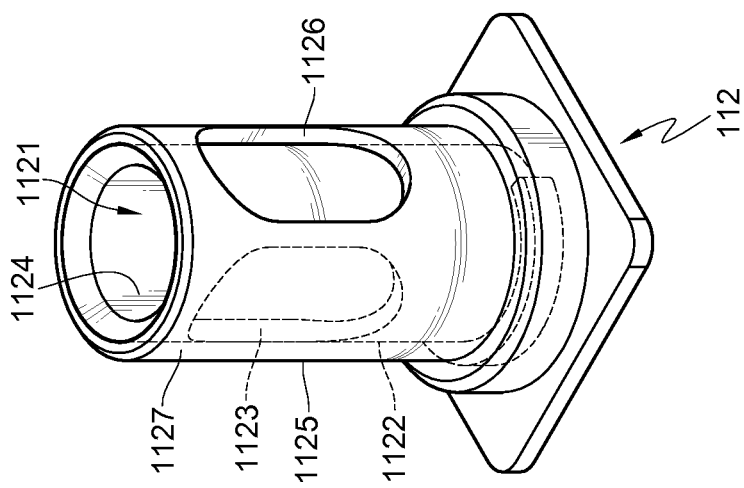

FIG. 5 to FIG. 7 are schematic views of operation of an adjustable valve according to an embodiment. Referring to FIG. 5 to FIG. 7 in combination with FIG. 4, the adjustable valve 112 according to this embodiment comprises an outer tube member 1125 and an inner tube member 1122. The outer tube member 1125 is disposed at the second chamber 1112. The outer tube member 1125 has an annular sidewall 1127. The annular sidewall 1127 has an outer valve port 1126. The outer valve port 1126 is in communication with the second chamber 1112. The inner tube member 1122 is pivoted on the outer tube member 1125, and may rotate relative to the outer tube member 1125. The inner tube member 1122 has an inner valve port 1123 and an opening 1121 in communication with each other. The inner tube member 1122 has an annular sidewall 1124. The inner valve port 1123 is located on the annular sidewall 1124. The opening 1121 is located at one end of the annular sidewall 1124. The opening 1121 is in communication with the first chamber 1111. The inner valve port 1123 corresponds to the outer valve port 1126.

The driver 113 drives the inner tube member 1122 to rotate relative to the outer tube member 1125, so as to make the inner valve port 1123 and the outer valve port 1126 not overlap each other, as shown in FIG. 5. At this moment, the adjustable valve 112 is in a closed state, and the cooling fluid in the second chamber 1112 cannot flow to the first chamber 1111.

The driver 113 drives the inner tube member 1122 to rotate relative to the outer tube member 1125, to make the inner valve port 1123 and the outer valve port 1126 partially overlap each other, as shown in FIG. 6. At this moment, the adjustable valve 112 is in a half-open state, and the cooling fluid in the second chamber 1112 may flow to the first chamber 1111 through a communication port jointly formed by the inner valve port 1123 and the outer valve port 1126.

The driver 113 drives the inner tube member 1122 to rotate relative to the outer tube member 1125, to make the inner valve port 1123 and the outer valve port 1126 completely overlap each other, as shown in FIG. 7. At this moment, the adjustable valve 112 is in a fully open state, and the cooling fluid in the second chamber 1112 may flow abundantly to the first chamber 1111 through a communication port jointly formed by the inner valve port 1123 and the outer valve port 1126.

Therefore, by moveably disposing the inner tube member 1122 relative to the outer tube member 1125, the adjustable valve 112 may adjust the relative positions of the inner valve port 1123 and the outer valve port 1126 to form communication ports of different sizes. In this way, the flow rate of the cooling fluid flowing from the second chamber 1112 to the first chamber 1111 may be controlled.

According to the server cabinet and the coolant pipe thereof of the disclosure, the coolant pipe comprises the multiple tube bodies connected in series. The adjustable valve may be disposed in at least one of the tube bodies, so that the adjustable valve controls the output liquid volume of the cooling fluid. In this way, the output volumes of the cooling fluid of the tube bodies at different heights may be close to each other, so that the heat exchangers on the trays acquire almost the same flow rate of the cooling fluid, thereby enabling the heat exchangers to achieve almost the same heat dissipation efficiency.

Furthermore, by modularizing the tube bodies, the assembler is enabled to adjust the number of the tube bodies according to actual demands, and connect the multiple tube bodies in series by using the first joint member, the second joint member and the closing member to form the coolant pipe of an expected length. Therefore, the coolant pipe according to this embodiment may be applied in server cabinets of various sizes and shapes, to save the extra cost of molds.

It will be understood that the invention is applicable to various kinds of cooling fluids, including air, water, and other gaseous and liquid coolants.

What is claimed is:

1. A server cabinet suitable for accommodating at least one tray, each tray bearing at least one heat source and a heat exchanger disposed on the heat source, the server cabinet including a coolant distribution system comprising:
   a first coolant pipe, comprising:
   multiple tube bodies interconnected in series, wherein each of the tube bodies includes a first chamber and a second chamber and the first chamber and the second chamber are adjacent to and separated from each other, the second chambers of each of the two adjacent tube bodies are in communication with each other, each of the tube bodies has at least one connection port in communication with the first chamber, and the connection port is suitable for being connected to the heat exchanger; and
   at least one adjustable valve disposed in each of the tube bodies, wherein the first chamber in each of the tube bodies is in communication with the second chamber in the tube body through the adjustable valve;
   a second coolant pipe, suitable for being connected to the heat exchanger; and
   a cooling circulation power device, connected to the first coolant pipe and the second coolant pipe;
   wherein the cooling circulation power device is used to drive a cooling fluid to flow to and through the second chambers of the tube bodies of the first coolant pipe, and each adjustable valve is used to adjust the flow rate of the cooling fluid in the corresponding tube body flowing from the second chamber to the first chamber, so that the cooling fluid flows from the first chamber to the heat exchanger to perform heat exchange on the heat source and flows back to the cooling circulation power device through the second coolant pipe.

2. The server cabinet according to claim 1, wherein each of the second chambers of each of the tube bodies are in direct series communication with each other, but the first chambers of each of the tube bodies are isolated from each other, except through the connection ports through which the first chambers communicate with their corresponding second chambers.

3. The server cabinet according to claim 1, wherein the first coolant pipe has a first end and a second end opposite to each other, and the second end is positioned higher than the first end.

4. The server cabinet according to claim 1, wherein the first coolant pipe further has at least one powered driver connected to at least one of the adjustable valves.

5. The server cabinet according to claim 1, wherein each of the adjustable valves is adjusted, relative to the adjustment of each of the other adjustable valves, so that an approximately equal flow of coolant is circulated into each of the multiple tube bodies.

6. The server cabinet according to claim 1, wherein each of the adjustable valves further comprises:
   an outer tube member, disposed in the second chamber, wherein the outer tube member has an outer valve port, and the outer valve port is in communication with the second chamber; and
   an inner tube member, pivoted inside the outer tube member, wherein the inner tube member has an opening is in communication with the first chamber, and an inner valve port in communication with the opening, and the inner tube member is used for rotating relative to the outer tube member to enable the inner valve port to be in communication with the outer valve port.

7. The server cabinet according to claim 1, wherein the first coolant pipe further has a first joint member disposed between the two adjacent tube bodies, the first joint member separates the two adjacent first chambers, the first joint member has a through hole, and the two adjacent second chambers are in communication with each other through the through hole.

8. The server cabinet according to claim 1, wherein the first coolant pipe further has a second joint member, the second joint member has a fluid port, the second joint member is disposed at one end of the tube body to which the powered cooling circulation device is connected, the second joint member closes the first chamber of the tube body, and the second chamber of the tube body is connected to the cooling circulation power device through the fluid port.

9. A multiple tray server cabinet cooling system comprising:
   a plurality of trays, each tray bearing at least one heat source and a heat exchanger disposed on the heat source;
   a supply flow duct, comprising a plurality of modular source flow bodies interconnected in series, each modular source flow body comprising:
      an arterial chamber that is in direct fluid communication with the arterial chamber of each adjacent modular source flow body;
      an auxiliary chamber, isolated from the auxiliary chambers of the other fluid-transferring bodies, and isolated also from the arterial chamber, except for a valve-controlled port that regulates fluid flow from the arterial chamber to the auxiliary chamber;
      at least one fluid communication tube fitting affixed to the auxiliary chamber, each tube fitting enabling coupling of the supply flow duct to a corresponding tube that supplies cooling fluid to a corresponding tray; and
      an adjustable valve that regulates the rate at which fluid can flow from the arterial chamber, through the valve-controlled port, to the auxiliary chamber;
   a return flow duct, comprising a plurality of modular return flow units interconnected in series, each modular return flow unit comprising:
      a return flow chamber that is in direct fluid communication with the return flow chamber of each adjacent modular return flow unit;
      at least one fluid communication tube fitting affixed to the return flow chamber, each tube fitting enabling coupling of the return flow duct to a corresponding tube that returns cooling fluid from a corresponding tray; and
   a powered cooling circulation device cooling the return flow and connecting the return flow duct to the supply flow duct.

10. The multiple tray server cabinet cooling system of claim 9, wherein each auxiliary chamber includes a plurality of fluid communication tube fittings.

11. The multiple tray server cabinet cooling system of claim 9, further comprising a powered driver for each adjustable valve.

12. The multiple tray server cabinet cooling system according to claim 11, wherein each of the adjustable valves is operable to be adjusted, relative to the adjustment of each of the other adjustable valves, so that an approximately equal flow of coolant is circulated into each of the multiple tube bodies.

13. The multiple tray server cabinet cooling system according to claim 9, wherein each of the adjustable valves further comprises:
   an outer tube member, disposed in one of the first and second chambers, wherein the outer tube member has an outer valve port, and the outer valve port is in communication with the corresponding chamber; and
   an inner tube member, pivoted inside the outer tube member, wherein the inner tube member has an opening in communication with the port connecting the first and second chambers, and an inner valve port in communication with the opening, and the inner tube member is used for rotating relative to the outer tube member to enable the inner valve port to be in communication with the outer valve port.

14. The multiple tray server cabinet cooling system according to claim 9, further comprising modular joint members operable to join any two of the supply flow ducts together, whereby the multiple tray server cabinet cooling system is operable to be assembled to any of a plurality of selectable lengths in accordance with a selected number of modular source flow bodies connected together.

* * * * *